United States Patent
Fukahori et al.

(10) Patent No.: US 9,450,370 B2
(45) Date of Patent: Sep. 20, 2016

(54) PLANAR WAVEGUIDE LASER DEVICE

(71) Applicants: Hidenori Fukahori, Tokyo (JP);
Takayuki Yanagisawa, Tokyo (JP);
Kyosuke Kuramoto, Tokyo (JP);
Fumio Shoda, Tokyo (JP)

(72) Inventors: Hidenori Fukahori, Tokyo (JP);
Takayuki Yanagisawa, Tokyo (JP);
Kyosuke Kuramoto, Tokyo (JP);
Fumio Shoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 26 days.

(21) Appl. No.: 14/412,566

(22) PCT Filed: Dec. 10, 2012

(86) PCT No.: PCT/JP2012/081946
§ 371 (c)(1),
(2) Date: Jan. 2, 2015

(87) PCT Pub. No.: WO2014/091540
PCT Pub. Date: Jun. 19, 2014

(65) Prior Publication Data
US 2015/0349482 A1    Dec. 3, 2015

(51) Int. Cl.
| | | |
|---|---|---|
| *H01S 3/109* | (2006.01) | |
| *H01S 3/063* | (2006.01) | |
| *H01S 3/08* | (2006.01) | |
| *H01S 5/14* | (2006.01) | |
| *H01S 3/0941* | (2006.01) | |
| *H01S 3/10* | (2006.01) | |

(52) U.S. Cl.
CPC .............. *H01S 3/109* (2013.01); *H01S 3/063* (2013.01); *H01S 3/0632* (2013.01); *H01S 3/08054* (2013.01); *H01S 5/14* (2013.01); *H01S 3/0941* (2013.01); *H01S 3/09415* (2013.01); *H01S 3/10061* (2013.01)

(58) Field of Classification Search
CPC .. H01S 3/109; H01S 3/0632; H01S 3/08054; H01S 3/091; H01S 3/093
See application file for complete search history.

(56) References Cited

U.S. PATENT DOCUMENTS

| | | | |
|---|---|---|---|
| 4,910,740 A | | 3/1990 | Oka |
| 5,038,352 A | * | 8/1991 | Lenth ..................... H01S 5/141 359/326 |
| 5,341,388 A | | 8/1994 | Masuda et al. |

(Continued)

FOREIGN PATENT DOCUMENTS

| | | |
|---|---|---|
| JP | H01-220879 A | 9/1989 |
| JP | H04-128825 A | 4/1992 |

(Continued)

OTHER PUBLICATIONS

International Search Report; PCT/JP2012/081946; Mar. 12, 2013.

(Continued)

*Primary Examiner* — Xinning Niu
(74) *Attorney, Agent, or Firm* — Studebaker & Brackett PC

(57) ABSTRACT

A laser medium 21 is shaped like a plate and has a waveguide structure in a direction of the thickness of a surface thereof perpendicular to the optical axis thereof. A nonlinear material 31 is placed on the optical axis of the laser medium 21 close to the laser medium 21 and has a waveguide structure in the same direction as that of the waveguide structure of the laser medium 21. A ¼ wavelength plate 41 is placed close to one of surfaces, which are perpendicular to the optical axis, of the nonlinear material 31, the one being opposite to a surface close to the laser medium 21.

9 Claims, 4 Drawing Sheets

(56) References Cited

U.S. PATENT DOCUMENTS

| | | | |
|---|---|---|---|
| 2010/0189151 A1 | 7/2010 | Yanagisawa et al. | |
| 2010/0202477 A1* | 8/2010 | Yanagisawa | H01S 3/109 |
| | | | 372/22 |
| 2013/0279910 A1* | 10/2013 | Ziari | H04J 14/06 |
| | | | 398/65 |

FOREIGN PATENT DOCUMENTS

| | | |
|---|---|---|
| JP | H06-132596 A | 5/1994 |
| JP | H07-022672 A | 1/1995 |
| JP | H07-131101 A | 5/1995 |
| JP | 3470849 B2 | 11/2003 |
| JP | 4754020 B2 | 8/2011 |
| WO | 2009/016703 A1 | 2/2009 |
| WO | 2009/016709 A1 | 2/2009 |

OTHER PUBLICATIONS

The extended European search report issued by the European Patent Office on Jul. 14, 2016, which corresponds to European Patent Application No. 12890099.0-1556 and is related to U.S. Appl. No. 14/412,566.

* cited by examiner

PLANAR WAVEGUIDE LASER DEVICE

FIELD OF THE INVENTION

The present invention relates to a planar waveguide laser device having a plane waveguide structure which is suitable for use as, for example, a light source for a printer, a projection TV, and so on.

BACKGROUND OF THE INVENTION

A plane waveguide type laser has a structure in which both the upper and lower surfaces of a thin plate-like laser medium extending in a traveling direction of laser light are sandwiched by clads whose refractive index is lower than that of the laser medium, and has a structure of making the laser medium also operate as a waveguide. Because this plane waveguide type laser has a thin waveguide thickness and a high excitation density, a large gain can be acquired and therefore an efficient oscillation operation can be implemented even when a laser medium having a small cross section for stimulated emission is used. In addition, by extending the waveguide in a width direction, scaling of the output power can be carried out while the excitation density is held at a predetermined value. On the other hand, there is an issue of making the laser oscillate in a linear polarization, which is required at the time of wavelength conversion.

Therefore, conventionally, a planar waveguide laser device that implements laser oscillation having a linear polarization, as shown in, for example, patent reference 1 has been proposed. This planar waveguide laser device is comprised of a laser medium having birefringence, and a clad material having a refractive index ranging between the refractive indexes for two polarized light rays which are traveling within the laser medium along an optical axis and whose planes of vibration are perpendicular to each other (TE (Transverse Electric) polarized light (polarized light whose plane of vibration is perpendicular to a plane formed by the c axis and the optical axis which is the traveling direction of the laser light and exists in a plane including the optical axis, and which is also called ordinary light), and TM (Transverse Magnetic) polarized light (polarized light whose plane of vibration exists in the plane formed by the c axis and the optical axis, and which is also called extraordinary light)). Because a material has a refractive index ranging between the refractive index for the TE polarization of the laser medium and the refractive index for the TM polarization of the laser medium is used as the clad, either the TE polarized light or the TM polarized light does not satisfy the total reflection condition, and therefore the laser oscillation of either one of the polarizations which satisfies the total reflection condition becomes possible.

RELATED ART DOCUMENT

Patent Reference

Patent reference 1: WO No. 2009/016703

SUMMARY OF THE INVENTION

Problems to be Solved by the Invention

However, in the planar waveguide laser device disclosed in above-mentioned patent reference 1, because the refractive index for the TE polarization of the laser medium and the refractive index for the TM polarization of the laser medium are equal when a material without birefringence is used as the laser medium, only one of the polarizations cannot be selected. Therefore, because the polarization other than the desired polarization is not wavelength-converted, the wavelength conversion efficiency degrades. A further problem is that because light which is a polarized component not wavelength-converted also consumes the gain in the laser medium and is amplified, the amplification factor for light which is a polarized component wavelength-converted also degrades, and it is therefore difficult to perform wavelength conversion efficiently.

Further, a material which can be applied as the clad material must have a refractive index ranging between the refractive index for the TE polarization of the laser medium and the refractive index for the TM polarization of the laser medium. For example, in a case in which $Nd:YVO_4$ is used as the laser medium, and is placed in such away that the c axis (optic axis) is aligned with a direction of a y axis, the laser medium has an ordinary light (polarization in a direction of an x axis) refractive index $no \approx 1.96$ ($=nx$), and an extraordinary light (polarization in the direction of the y axis) refractive index $ne \approx 2.17$ ($=ny$). Another problem is that because the clad material must be a material having a refractive index ranging between 1.96 and 2.17 at this time, the applicable material is greatly restricted depending upon its refractive index.

The present invention is made in order to solve the problems, and it is therefore an object of the present invention to provide a planar waveguide laser device that can perform wavelength conversion efficiently also when using a laser medium which does not have birefringence. It is another object of the present invention to increase the number of types selectable as a clad material.

Means for Solving the Problem

In accordance with the present invention, there is provided a planar waveguide laser device including: a laser medium that is shaped like a plate and has a waveguide structure in a direction of the thickness of a surface thereof perpendicular to the optical axis thereof, and that generates a gain for both light rays, of equal wavelength, polarized in directions perpendicular and horizontal to a waveguide of the waveguide structure; a nonlinear material that is placed on the optical axis of the laser medium close to the laser medium and has a waveguide structure in a direction which is the same as that of the waveguide structure of the laser medium, and that performs wavelength conversion on the polarized light rays; and a ¼ wavelength plate that is placed close to one of surfaces, which are perpendicular to the optical axis, of the nonlinear material, the one being opposite to a surface close to the laser medium, and that rotates the polarized light rays.

Advantages of the Invention

Because the ¼ wavelength plate is placed close to one of the surfaces, which are perpendicular to the optical axis, of the nonlinear material, the one being opposite to the surface close to the laser medium, in the planar waveguide laser device in accordance with the present invention, the polarization of laser oscillation light in the resonator is rotated by 90 degrees by the ¼ wavelength plate every time when the light makes one round trip in the resonator. As a result, the laser oscillation light in the resonator certainly makes one round trip in the resonator in any of TM and TE polarizations during two round trips, and therefore any of the polarized components generated within the laser medium is wavelength-converted during one of the two round trips. Therefore, even in a case of using a material which does not have birefringence is used as the laser medium, an efficient wavelength conversion laser can be provided.

EMBODIMENTS OF THE INVENTION

Hereafter, in order to explain this invention in greater detail, the preferred embodiments of the present invention will be described with reference to the accompanying drawings.

Embodiment 1.

Figure 1:
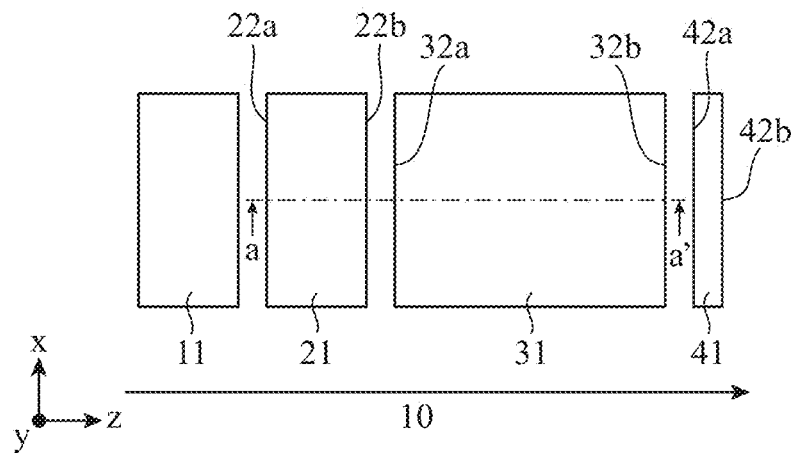
FIG. 1 is a structural diagram of a planar waveguide laser device in accordance with Embodiment 1 of the present invention.
Figure 2:
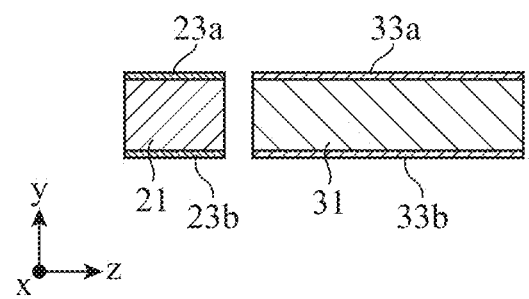
FIG. 2 is a cross-sectional view taken along the a-a' line of FIG. 1.

FIG. 1 is a structural diagram of a planar waveguide laser device in accordance with this embodiment, and FIG. 2 is a cross-sectional view taken along the a-a' line of FIG. 1. The planar waveguide laser device in accordance with this Embodiment 1 includes a laser medium 21 that is shaped like a plate and has a waveguide structure in a direction of the thickness of a cross section thereof perpendicular to an optical axis 10 showing a laser oscillation direction, a nonlinear material 31 that has a waveguide structure in a direction which is the same as that of the waveguide structure of the laser medium 21, and a ¼ wavelength plate 41 that is placed in front of the nonlinear material 31.

In the laser medium 21, the shape of end surfaces 22a and 22b perpendicular to the optical axis 10 is, for example, a rectangle. The laser medium typically has a thickness in a direction of a y axis of several to several hundred μm and a width in a direction of an x axis of several hundred μm to several mm. Hereafter, for convenience of explanation, a coordinate system in which the x axis is a long side direction of the rectangle, the y axis is a short side direction of the rectangle, and a z axis is a direction of the optical axis 10 is used. The short side of each of the end surfaces 22a and 22b of the laser medium 21 can be round, and each of the end surfaces is not necessarily a rectangle.

The nonlinear material 31 has a cross section being perpendicular to the optical axis 10 and having substantially the same shape as that of the laser medium 21 and has end surfaces 32a and 32b perpendicular to the optical axis 10, and is placed in such a way that the end surface 32a is close to the end surface 22b of the laser medium 21.

Clads 23a and 23b having a smaller refractive index than that of the laser medium 21 are respectively bonded to both of upper and lower surfaces of the laser medium 21 (surfaces parallel to an xz plane), or one of the clads is bonded to one of the upper and lower surfaces. The clads 23a and 23b are constructed by, for example, vapor-depositing a film made from an optical material as a raw material, or optically bonding an optical material to the laser medium 21 by using optical contact or diffusion bonding. Further, an optical adhesive bond having a smaller refractive index than that of the laser medium. 21 can be used. As an alternative, the clads 23a and 23b can be eliminated, and, in this case, air serves as clads.

Clads 33a and 33b having a smaller refractive index than that of the nonlinear material 31 are respectively bonded to both of upper and lower surfaces of the nonlinear material 31 (surfaces parallel to the xz plane), or one of the clads is bonded to one of the upper and lower surfaces. The clads 33a and 33b are constructed by, for example, vapor-depositing a film made from an optical material as a raw material, or optically bonding an optical material to the nonlinear material 31 by using optical contact or diffusion bonding, like the above-mentioned clads 23a and 23b. Further, an optical adhesive bond having a smaller refractive index than that of the nonlinear material 31 can be used. As an alternative, the clads 33a and 33b can be eliminated, and, in this case, air serves as clads.

Further, a semiconductor laser 11 is placed close to the end surface 22a of the laser medium 21, and, as needed, a not shown heat sink for cooling is connected to the semiconductor laser. The semiconductor laser 11 has a size in a direction of the x axis which is nearly equal to that in a direction of the x axis of the laser medium 21, and uniformly outputs pumping light toward a direction of the x axis. The pumping light outputted from the semiconductor laser 11 is incident on the laser medium 21 in a direction of the xz plane from the end surface 22a, and is absorbed by the laser medium 21.

A total reflection film that reflects fundamental laser light is formed on the end surface 22a of the laser medium 21, an antireflection film that allows the fundamental laser light to pass therethrough is formed on the end surface 22b, an optical film that allows the fundamental laser light to pass therethrough and reflects second harmonic laser light is formed on the end surface 32a of the nonlinear material 31, an optical film that allows the fundamental laser light and the second harmonic laser light to pass therethrough is formed on the end surface 32b, an optical film that allows the fundamental laser light and the second harmonic laser light to pass therethrough is formed on an end surface 42a of the ¼ wavelength plate 41, and an optical film that reflects the fundamental laser light and allows the second harmonic laser light to pass therethrough is formed on an end surface 42b. Each of these total reflection film, partial reflection film, and optical film is formed by, for example, laminating a dielectric thin film. In a case in which the pumping light outputted from the semiconductor laser 11 is made to be incident on the laser medium 21 from the end surface 22a of the laser medium 21, the total reflection film formed on the end surface 22a is replaced by an optical film that allows the pumping light to pass therethrough and reflects the fundamental laser light.

As the laser medium 21, a general solid state laser material can be used. For example, Nd:YAG, Nd:YLF, Nd:Glass, Nd:YVO$_4$, Nd:GdVO$_4$, Yb:YAG, Yb:YLF, Yb:KGW, Yb:KYW, Er:Glass, Er:YAG, Tm:YAG, Tm:YLF, Ho:YAG, Ho:YLF, Tm, Ho:YAG, Tm, Ho:YLF, Ti:Sapphire, Cr:LiSAF, or the like is used.

Further, as the nonlinear material 31, a general wavelength conversion material can be used. For example, KTP, KN, BBO, LBO, CLBO, LiNbO$_3$, LiTaO$_3$, or the like is used. Further, in a case of using MgO-doped LiNbO$_3$, MgO-doped LiTaO$_3$, stoichiometric LiNbO$_3$, or stoichiometric LiTaO$_3$ which is resistant to optical damage, efficient wavelength conversion can be carried out because the power density of the incident fundamental laser light can be improved. In addition, in a case of using MgO-doped LiNbO$_3$, MgO-doped LiTaO$_3$, stoichiometric LiNbO$_3$, stoichiometric LiTaO$_3$, or KTP which has a periodic polarization inversion structure, further efficient wavelength conversion can be carried out because it has a large nonlinear constant.

Figure 3:
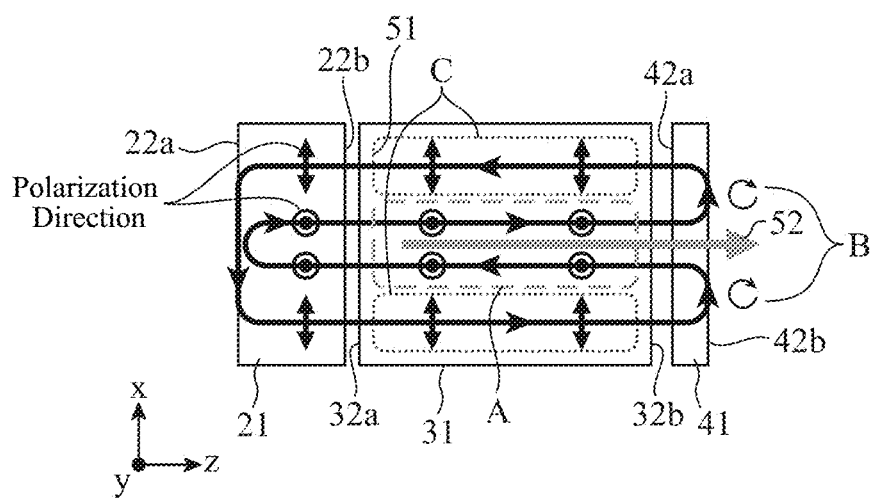
FIG. 3 is an explanatory drawing schematically showing a polarization state of fundamental laser light in a resonator of the planar waveguide laser device in accordance with Embodiment 1 of the present invention.

Next, the operation of the planar waveguide laser device in accordance with Embodiment 1 will be explained. FIG. 3 is a diagram schematically showing a polarization state of fundamental laser light in the resonator of the planar waveguide laser device in accordance with Embodiment 1 of the present invention. The pumping light incident on the laser medium 21 from the end surface 22a of the laser medium 21 is absorbed within the laser medium 21, and generates a gain for fundamental laser light within the laser medium 21. By virtue of the gain generated within the laser medium 21, fundamental laser light laser-oscillates between the end surface 22a of the laser medium 21 and the end surface 42b of the ¼ wavelength plate 41.

A case in which the fundamental laser light generated by the laser medium 21 oscillates in both TE and TM polarizations (in a case of either using an isotropic material not having birefringence as the laser medium 21, or using a material having birefringence as the laser medium 21 and using clads having a lower refractive index than any of the ordinary refractive index and the extraordinary refractive index of the laser medium 21).

Hereafter, a case in which MgO-doped LiNbO$_3$ having a periodic polarization inversion structure of the hexagonal crystal system is used as the nonlinear material 31 will be explained. The c axis of the nonlinear material 31 (which is a crystallographic axis and is also an optic axis) is aligned with a direction of the y axis. Further, the a axis (crystallographic axis) is aligned with the optical axis 10. In this case, wavelength conversion is performed only on TM polarized light in the nonlinear material 31. In addition, the temperature or the period of the periodic polarization inversion of the nonlinear material 31 is optimized in such a way as to, when the fundamental laser light is incident on the nonlinear material, convert the fundamental laser light into second harmonic laser light according to a nonlinear effect.

First, a case in which the fundamental laser light having a TM polarization is incident on the nonlinear material 31 will be explained. When the fundamental laser light 51 having a TM polarization is incident on the nonlinear material 31, a part of the fundamental laser light is converted into second harmonic light, and the second harmonic light passes through the end surface 32b and the ¼ wavelength plate 41 and is outputted from the end surface 42b to outside the laser device as wavelength converted light 52, as shown in A in the figure. The fundamental laser light 51 which has remained without being converted into the second harmonic laser light is incident on the ¼ wavelength plate 41, is total-reflected by the end surface 42b, passes through the ¼ wavelength plate 41 once again, and is incident on the nonlinear material 31 again from the end surface 32b. At this time, the fundamental laser light 51 which has remained makes a round trip in the ¼ wavelength plate 41, and, as a result, experiences a rotation of its polarization by 90 degrees and is incident on the nonlinear material 31 as TE polarized light, as shown in B in the figure. Therefore, this fundamental laser light 51 that has remained passes through the nonlinear material 31 without being wavelength-converted and is incident on the laser medium 21 from the end surface 22b, as shown in C in the figure. The fundamental laser light 51 which has returned to the laser medium 21 and has remained is amplified by the gain in the laser medium 21, is total-reflected by the end surface 22a, passes through the laser medium 21 again and is amplified by this medium, and is incident on the nonlinear material 31 from the end surface 32a. This fundamental laser light 51 which has remained and has been amplified passes through the nonlinear material 31 without being wavelength-converted because the fundamental laser light has a TE polarization, makes a round trip in the ¼ wavelength plate 41 in the same way as above and experiences a rotation of its polarization by 90 degrees to turn into TM polarized light, and is incident on the nonlinear material 31. A part of the fundamental laser light 51 which has turned into TM polarized light and is incident on the nonlinear material 31 is converted into second harmonic light, and the second harmonic light is total-reflected by the end surface 32a, passes through the end surface 32b and the ¼ wavelength plate 41, and is outputted from the end surface 42b to outside the laser device as wavelength converted light 52.

Next, a case in which the fundamental laser light 51 having a TE polarization is incident on the nonlinear material 31 will be explained. When the fundamental laser light 51 having a TE polarization is incident on the nonlinear material 31, the fundamental laser light passes through the nonlinear material 31 without being wavelength-converted, is incident on the ¼ wavelength plate 41 from the end surface 42a, is total-reflected by the end surface 42b, passes through the ¼ wavelength plate 41 once again, and is incident on the nonlinear material 31 again from the end surface 32b, as shown in C in the figure. At this time, the fundamental laser light 51 makes a round trip in the ¼ wavelength plate 41, and, as a result, experiences a rotation of its polarization by 90 degrees and is incident on the nonlinear material 31 as TM polarized light, as shown in B in the figure. Apart of the fundamental laser light 51 which has turned into TM polarized light and is incident on the nonlinear material 31 is converted into second harmonic light, and the second harmonic light is total-reflected by the end surface 32a, passes through the end surface 32b and the ¼ wavelength plate 41, and is outputted from the end surface 42b to outside the laser device as wavelength converted light 52, as shown in A in the figure. The fundamental laser light 51 which has remained without being wavelength-converted is incident on the laser medium 21 from the end surface 22b, is amplified by the gain in the laser medium, is total-reflected by the end surface 22a, passes through the laser medium 21 again and is amplified by this medium, and is incident on the nonlinear material 31 from the end surface 32a. Apart of the fundamental laser light 51 incident on the nonlinear material 31 is converted into second harmonic light, and the second harmonic light passes through the end surface 32b and the ¼ wavelength plate 41 and is outputted from the end surface 42b to outside the laser device as wavelength converted light 52. The fundamental laser light 51 which has remained without being wavelength-converted makes a round trip in the ¼ wavelength plate 41 again, experiences a rotation of its polarization by 90 degrees to turn into TE polarized light, passes through the nonlinear material 31 without being wavelength-converted, and returns to the laser medium 21.

Because any of the laser light rays which are the TM polarization and TE polarized components generated within the laser medium 21 certainly makes a round trip as TM polarized light and is wavelength-converted during one of two round trips within the resonator, an efficient wavelength conversion laser can be provided.

Figure 4:
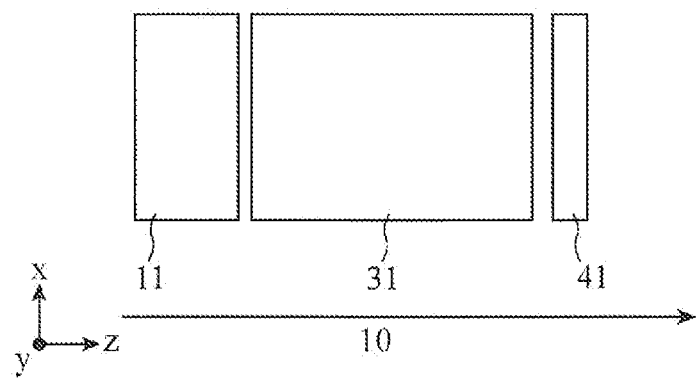
FIG. 4 is a structural diagram of a polarization control planar waveguide laser device in a case of using a semiconductor laser 11 instead of a laser medium 21 of FIG. 1.

Although a solid state laser medium that is pumped by the semiconductor laser 11 to generate a gain is used as the laser medium 21 in the planar waveguide laser device shown in FIG. 1, the semiconductor laser 11 can be used as the laser medium, as shown in FIG. 4. Although illustration is omitted, by applying a voltage between the upper and lower surfaces of the semiconductor laser 1 to feed a current through this laser, the semiconductor laser 11 generates a gain for laser light with a desired wavelength.

Because the component count can be reduced compared with the planar waveguide laser device shown in FIG. 1 in the case in which the laser device is constructed this way, the manufacturing cost can be reduced. Further, because the optical components are few in number, a high-reliability planar waveguide laser device which requires a smaller number of adjustments can be constructed.

Although the material, as the laser medium, which oscillates both in a TE polarization direction and in a TM polarization direction is explained in this embodiment, even in a case in which a laser medium that oscillates only a polarized component which is not wavelength-converted (a TE polarized component in the case in which MgO-doped LiNbO$_3$ having a periodic polarization inversion structure of the hexagonal crystal system is used as the nonlinear material 31) is used, efficient wavelength conversion laser light is acquired because the polarization direction changes every time when the fundamental laser light 51 makes a round trip and therefore the fundamental laser light 51 certainly turns into a polarized component which is wavelength-converted and passes through the nonlinear material 31d during one round trip while making two round trips in the structure shown in any of FIGS. 1 and 4.

Further, although the material, as the nonlinear material 31, which performs wavelength conversion only on TM polarized light is explained, the present invention can also be applied to a case in which a material that performs wavelength conversion only on TE polarized light is used.

Although not particularly explained above, the ¼ wavelength plate 41 can also have a waveguide structure in the same direction as that of the waveguide structure of the laser medium 21, or can be a bulk body without a waveguide structure.

As previously explained, because the planar waveguide laser device in accordance with Embodiment 1 includes: the laser medium that is shaped like a plate and has a waveguide structure in a direction of the thickness of a surface thereof perpendicular to the optical axis thereof; the nonlinear material that is placed on the optical axis of the laser medium close to the laser medium and has a waveguide structure in the same direction as that of the waveguide structure of the laser medium; and the ¼ wavelength plate that is placed close to one of surfaces, which are perpendicular to the optical axis, of the nonlinear material, the one being opposite to a surface close to the laser medium, a planar waveguide laser device that can perform wavelength conversion efficiently can be provided. Further, the number of types of materials selectable as the clad material can be increased.

In addition, because the laser medium can be a semiconductor laser in the planar waveguide laser device in accordance with Embodiment 1, the manufacturing cost can be reduced because the component count can be reduced. Further, because the optical components are few in number, a high-reliability planar waveguide laser device which requires a smaller number of adjustments can be constructed.

In addition, because the laser medium can be a solid state laser medium that is pumped by a semiconductor laser placed close to the laser medium to generate a gain in the planar waveguide laser device in accordance with Embodiment 1, efficient wavelength conversion laser light can be acquired.

Further, because the ¼ wavelength plate is constructed in such a way as to have a waveguide structure in the same direction as that of the waveguide structure of the laser medium in the planar waveguide laser device in accordance with Embodiment 1, efficient wavelength conversion laser light can be acquired.

Embodiment 2.

Although the case in which the ¼ wavelength plate 41 is placed on a side of the end surface 32b of the nonlinear material 31 is explained in Embodiment 1, the ¼ wavelength plate 41 can be alternatively placed on a side of the end surface 22a of the laser medium 21. In this case, the polarization direction of the fundamental laser light within the resonator is controlled similarly so that efficient wavelength conversion laser light can be acquired. Hereafter, this example will be explained as Embodiment 2.

Figure 5:
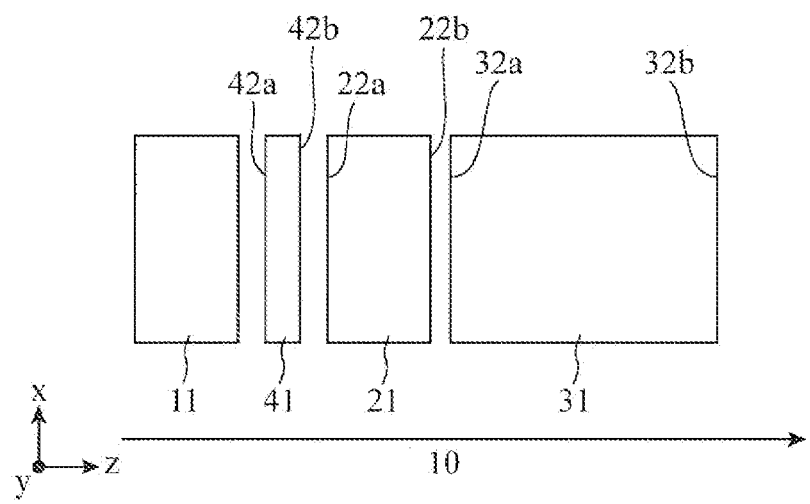
FIG. 5 is a structural diagram of a planar waveguide laser device in accordance with Embodiment 2 of the present invention.

FIG. 5 is a structural diagram of a planar waveguide laser device in accordance with Embodiment 2. The planar waveguide laser device in accordance with this Embodiment 2 includes a laser medium 21 that is shaped like a plate and has a waveguide structure in a direction of the thickness of a cross section thereof perpendicular to an optical axis 10 showing a laser oscillation direction, a nonlinear material 31 that has a waveguide structure in a direction which is the same as that of the waveguide structure of the laser medium 21, and a ¼ wavelength plate 41 that is placed at the back of the laser medium 21.

An antireflection film that allows fundamental laser light to pass therethrough is formed on each of end surfaces 22a and 22b of the laser medium 21, an optical film that allows the fundamental laser light to pass therethrough and reflects second harmonic laser light is formed on an end surface 32a of the nonlinear material 31, an optical film that reflects the fundamental laser light and allows the second harmonic laser light to pass therethrough is formed on an end surface 32b, an optical film that total-reflects the fundamental laser light is formed on an end surface 42a of the ¼ wavelength plate 41, and an optical film that allows the fundamental laser light to pass therethrough is formed on an end surface 42b. Each of these total reflection film, partial reflection film, and optical film is formed by, for example, laminating a dielectric thin film. In a case of making the pumping light outputted from the semiconductor laser 11 pass through the ¼ wavelength plate 41 and be incident on the laser medium 21 from the end surface 22a of the laser medium 21, an optical film that allows the pumping light to pass therethrough and reflects the fundamental laser light is formed on the end surface 42a, and an optical film that allows the pumping light and the fundamental laser light to pass therethrough is formed on each of the end surfaces 42b and 22a.

The planar waveguide laser device in accordance with Embodiment 2 has the same structure as that in accordance with Embodiment 1 with the exception that the ¼ wavelength plate 41 is placed at a different position and the types of optical films formed on the end surfaces differ from those of Embodiment 1.

Figure 6:
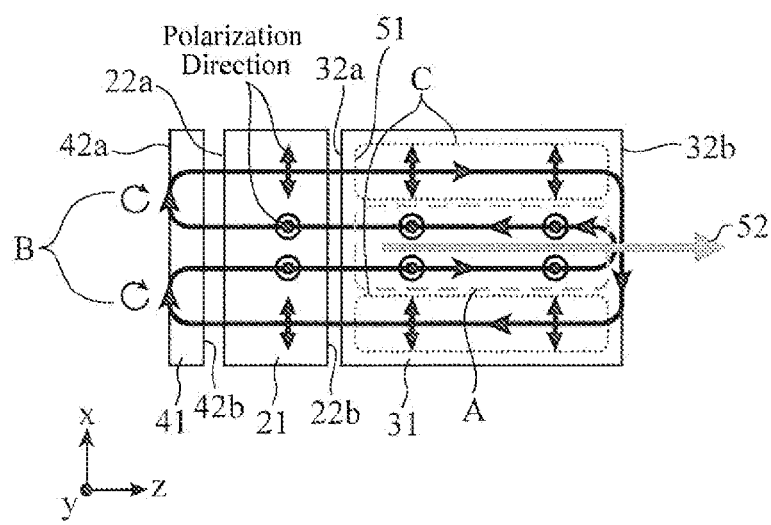
FIG. 6 is an explanatory drawing schematically showing a polarization state of fundamental laser light in a resonator of the planar waveguide laser device in accordance with Embodiment 2 of the present invention.

Next, the operation of the planar waveguide laser device in accordance with Embodiment 2 will be explained. FIG. 6 is a diagram schematically showing a polarization state of fundamental laser light 51 in the resonator of the polarization control planar waveguide laser device in accordance with Embodiment 1 of the present invention. The pumping light incident on the laser medium 21 from the end surface 22a of the laser medium 21 is absorbed within the laser medium 21, and generates a gain for the fundamental laser light 51 within the laser medium 21. By virtue of the gain generated within the laser medium 21, the fundamental laser light 51 laser-oscillates between the end surface 42a of the ¼ wavelength plate 41 and the end surface 32b of the nonlinear material 31.

A case in which the fundamental laser light 51 generated by the laser medium 21 oscillates in both TE and TM polarizations (in a case of using an isotropic material not having birefringence as the laser medium 21, or using a material having birefringence as the laser medium 21 and using clads having a lower refractive index than any of the ordinary refractive index and the extraordinary refractive index of the laser medium 21).

Hereafter, a case in which MgO-doped LiNbO₃ having a periodic polarization inversion structure of the hexagonal crystal system is used as the nonlinear material 31 will be explained. The c axis of the nonlinear material 31 (which is a crystallographic axis and is also an optic axis) is aligned with a direction of a y axis. Further, the a axis (crystallographic axis) is aligned with the optical axis 10. In this case, wavelength conversion is performed only on TM polarized light in the nonlinear material 31. In addition, the temperature or the period of the periodic polarization inversion of the nonlinear material 31 is optimized in such a way as to, when the fundamental laser light is incident thereupon, convert the fundamental laser light into second harmonic laser light according to a nonlinear effect.

First, a case in which the fundamental laser light 51 having a TM polarization is incident on the nonlinear material 31 will be explained. When the fundamental laser light 51 having a TM polarization is incident on the nonlinear material 31, a part of the fundamental laser light 51 is converted into second harmonic light and the second harmonic light is outputted from the end surface 32b to outside the laser device as wavelength converted light 52, as shown in A in the figure. The fundamental laser light 51 which has remained without being converted into the second harmonic laser light is total-reflected by the end surface 32b, and is incident on the nonlinear material 31 again. A part of the fundamental laser light 51 which has remained is converted into second harmonic light, and the second harmonic light is total-reflected by the end surface 32a and is outputted from the end surface 32b to outside the laser device as wavelength converted light 52. The fundamental laser light 51 which has remained without being converted into the second harmonic laser light passes through the laser medium 21, and is amplified by the gain in the laser medium. This fundamental laser light 51 is incident on the ¼ wavelength plate 41 from the end surface 42b, and is total-reflected by the end surface 42a, passes through the ¼ wavelength plate 41 once again, and is incident on the laser medium 21 again. At this time, the fundamental laser light 51 makes a round trip in the ¼ wavelength plate 41, and, as a result, experiences a rotation of its polarization by 90 degrees, and passes through the laser medium 21 as TE polarized light and is amplified by the gain in the laser medium, as shown in B in the figure. Although the fundamental laser light 51 which has turned into TE polarized light is incident on the nonlinear material 31 from the end surface 32a, is not wavelength-converted, is reflected by the end surface 32b, passes through the nonlinear material 31, and is incident on the laser medium 21 again, as shown in C in the figure. The fundamental laser light then passes through the laser medium and makes a round trip in the ¼ wavelength plate 41 in the same way as above, and, as a result, experiences a rotation of its polarization by 90 degrees to turn into TM polarized light again, is incident on the nonlinear material 31, and is wavelength-converted.

Next, a case in which the fundamental laser light 51 having a TE polarization is incident on the nonlinear material 31 will be explained. When the fundamental laser light 51 having a TE polarization is incident on the nonlinear material 31, the fundamental laser light passes through the nonlinear material 31 without being wavelength-converted, is total-reflected by the end surface 32b, passes through the nonlinear material 31 again, and is incident on the laser medium 21 from the end surface 22b, as shown in C in the figure. The fundamental laser light 51 incident on the laser medium 21 passes through the laser medium 21 and is amplified by the gain in the laser medium. This fundamental laser light 51 is incident on the ¼ wavelength plate 41 from the end surface 42b, and is total-reflected by the end surface 42a, further passes through the ¼ wavelength plate 41 once again, and is incident on the laser medium 21 again. At this time, the fundamental laser light 51 makes a round trip in the ¼ wavelength plate 41, and, as a result, experiences a rotation of its polarization by 90 degrees, and passes through the laser medium 21 as TM polarized light and is amplified by the gain in the laser medium, as shown in B in the figure. The fundamental laser light 51 which has turned into TM polarized light is incident on the nonlinear material 31 again from the end surface 32a, and a part of the light is converted into second harmonic light and the second harmonic light is outputted from the end surface 32b to outside the laser device as wavelength converted light 52, as shown in A in the figure. The fundamental laser light 51 which has remained without being converted into the second harmonic laser light is total-reflected by the end surface 32b and is incident on the nonlinear material 31 again. A part of the fundamental laser light 51 which has remained is converted into second harmonic light, and the second harmonic light is total-reflected by the end surface 32a and is outputted from the end surface 32b to outside the laser device as wavelength converted light 52.

Because any of the laser light rays which are the TM polarization and TE polarized components generated within the laser medium 21 certainly makes a round trip as TM polarized light and is wavelength-converted during one of two round trips within the resonator, an efficient wavelength conversion laser can be provided. Further, because the wavelength conversion laser light outputted does not pass through the ¼ wavelength plate 41, the laser light is outputted in a linear polarization.

Figure 7:
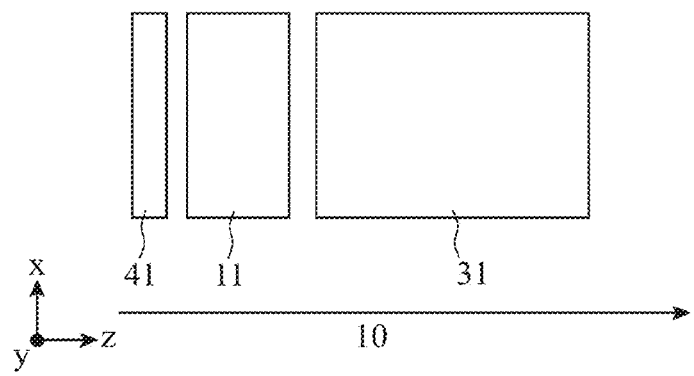
FIG. 7 is a structural diagram of the planar waveguide laser device in a case of using a semiconductor laser 11 instead of a laser medium 21 of FIG. 5.

Although a solid state laser medium that is pumped by the semiconductor laser 11 to generate a gain is used as the laser medium 21 in the planar waveguide laser device shown in FIG. 5, the semiconductor laser 11 can be used as the laser medium, as shown in FIG. 7. Although illustration is omitted, by applying a voltage between the upper and lower surfaces of the semiconductor laser 11 to feed a current through this laser, the semiconductor laser 11 generates a gain for laser light with a desired wavelength.

Because the component count can be reduced compared with the planar waveguide laser device shown in FIG. 5 in the case in which the laser device is constructed this way, the manufacturing cost can be reduced. Further, because the optical components are few in number, a high-reliability planar waveguide laser device which requires a smaller number of adjustments can be constructed.

Further, because the ¼ wavelength plate 41 is placed between the semiconductor laser 11 and the laser medium 21 in the structure of FIG. 5, there is a case in which the semiconductor laser 11 cannot be placed close to the end surface 22a of the laser medium 21 depending on the thickness in a direction of the optical axis of the ¼ wavelength plate 41. In this case, the semiconductor laser 11 can be placed close to a side surface of the laser medium 21, as shown in FIG. 8.

Figure 8:
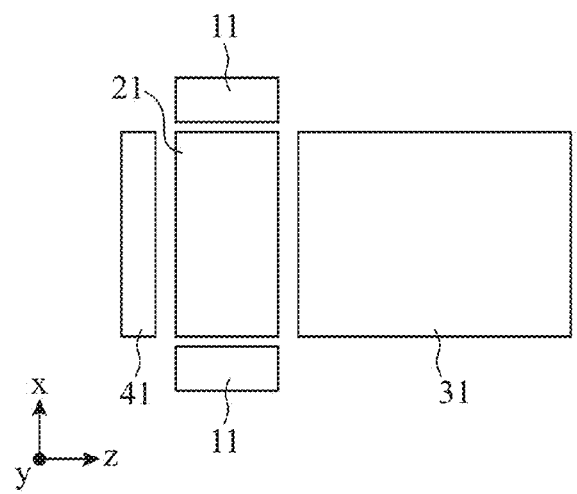
FIG. 8 is a structural diagram of the planar waveguide laser device in accordance with Embodiment 2 in which the semiconductor laser 11 is placed on a side surface of the laser medium 21.

Although the material, as the laser medium, which oscillates both in a TE polarization direction and in a TM polarization direction is explained in this embodiment, even in a case in which a laser medium that oscillates only a polarized component which is not wavelength-converted (a TE polarized component in the case in which MgO-doped LiNbO$_3$ having a periodic polarization inversion structure of the hexagonal crystal system is used as the nonlinear material 31) is used, efficient wavelength conversion laser light is acquired because the polarization direction of the fundamental laser light changes every time when making a round trip and therefore the fundamental laser light certainly turns into a polarized component which is wavelength-converted and passes through the nonlinear material 31 during one round trip while making two round trips in the structure shown in any of FIGS. 5 and 8.

Further, although the material, as the nonlinear material 31, which performs wavelength conversion only on TM polarized light is explained, the present invention can also be applied to a case in which a material that performs wavelength conversion only on TE polarized light is used.

Although not particularly explained above, the ¼ wavelength plate 41 can also have a waveguide structure in the same direction as that of the waveguide structure of the laser medium 21, or can be a bulk body without a waveguide structure.

As previously explained, because the planar waveguide laser device in accordance with Embodiment 2 includes: the laser medium that is shaped like a plate and has a waveguide structure in a direction of the thickness of a surface thereof perpendicular to the optical axis thereof; the nonlinear material that is placed on the optical axis of the laser medium close to the laser medium and has a waveguide structure in the same direction as that of the waveguide structure of the laser medium; and the ¼ wavelength plate that is placed close to one of surfaces which are perpendicular to the optical axis of the laser medium, the one being opposite to a surface close to the nonlinear material, a planar waveguide laser device that can perform wavelength conversion efficiently can be provided. Further, the number of types of materials selectable as a clad material can be increased.

Embodiment 3.

Although the method of rotating the polarization of fundamental laser light by 90 degrees during each round trip by using a ¼ wavelength plate is shown in Embodiments 1 and 2, the nonlinear material 31 can be made to have the same function as that of the wavelength plate by placing the nonlinear material with its optic axis being inclined. Hereafter, this example will be explained as Embodiment 3.

Figure 9:
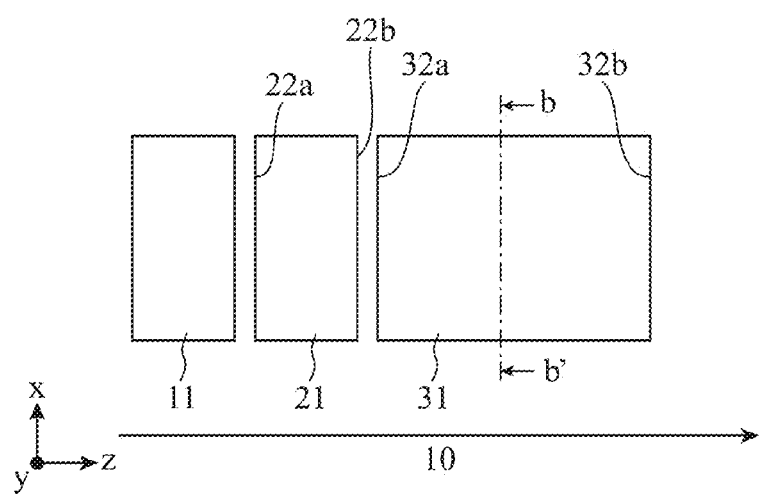
FIG. 9 is a structural diagram of a polarization control planar waveguide laser device in accordance with Embodiment 3 of the present invention.
Figure 10:
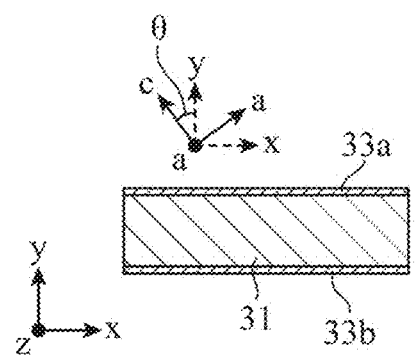
FIG. 10 is a cross-sectional view taken along the b-b' line of FIG. 9.

FIG. 9 is a structural diagram of a planar waveguide laser device in accordance with Embodiment 3, and FIG. 10 is a schematic diagram showing a cross section taken along the line b-b' of FIG. 9 and a direction of an optic axis of a nonlinear material 31. The planar waveguide laser device in accordance with this Embodiment 3 includes a laser medium 21 that is shaped like a plate and has a waveguide structure in a direction of the thickness of a cross section thereof perpendicular to an optical axis 10 showing a laser oscillation direction, a nonlinear material 31 that has a waveguide structure in the same direction as that of the waveguide structure of the laser medium 21, and is characterized in that the c axis of this nonlinear material 31 is inclined by an angle θ with respect to a y axis in a plane perpendicular to the optical axis 10.

A total reflection film that reflects fundamental laser light is formed on an end surface 22a of the laser medium 21, an antireflection film that allows the fundamental laser light to pass therethrough is formed on an end surface 22b, an optical film that allows the fundamental laser light to pass therethrough and reflects second harmonic laser light is formed on an end surface 32a of the nonlinear material 31, and an optical film that reflects the fundamental laser light and allows the second harmonic laser light to pass therethrough is formed on an end surface 32b. Each of these total reflection film, partial reflection film, and optical film is formed by, for example, laminating a dielectric thin film. In a case in which pumping light outputted from a semiconductor laser 11 is made to be incident on the laser medium 21 from the end surface 22a of the laser medium 21, the total reflection film formed on the end surface 22a is replaced by an optical film that allows the pumping light to pass therethrough and reflects the fundamental laser light.

The planar waveguide laser device in accordance with Embodiment 3 has the same structure as that in accordance with Embodiment 1 with the exception that the planar waveguide laser device does not have a ¼ wavelength plate 41, the optic axis of the nonlinear material 31 is inclined, and the types of optical films formed on the end surfaces differ from those of Embodiment 1.

When the angle which the c axis of the nonlinear material 31 forms with the y axis is denoted by θ, the phase difference between a polarized component in a direction of the c axis of the fundamental laser light and a polarized component in a direction of the a axis of the fundamental laser light in the nonlinear material 31 is denoted by $\Gamma(=2\pi(n_e-n_o)L/\lambda)$, the intensity transmission of the polarized component in the direction of the c axis is denoted by η$c$, and the intensity transmission of the polarized component in the direction of the a axis is denoted by η$a$ (in a case in which MgO-doped LiNbO$_3$ having a periodic polarization inversion structure of the hexagonal crystal system is used as the nonlinear material 31, η$c$=1−(wavelength conversion efficiency) and η$a$=1), a Jones matrix at the time when the fundamental laser light makes a round trip in the nonlinear material 31 is expressed by the following equation. In this case, L denotes the crystal length of the nonlinear material 31, and λ denotes the wavelength of the fundamental laser light.

$$J = \begin{pmatrix} \cos\theta & \sin\theta \\ -\sin\theta & \cos\theta \end{pmatrix} \begin{pmatrix} \sqrt{\eta_a} & 0 \\ 0 & \sqrt{\eta_c} \end{pmatrix} \begin{pmatrix} e^{i\Gamma/2} & 0 \\ 0 & e^{-i\Gamma/2} \end{pmatrix}$$

$$\begin{pmatrix} \sqrt{\eta_a} & 0 \\ 0 & \sqrt{\eta_c} \end{pmatrix} \begin{pmatrix} e^{i\Gamma/2} & 0 \\ 0 & e^{-i\Gamma/2} \end{pmatrix} \begin{pmatrix} \cos(-\theta) & \sin(-\theta) \\ -\sin(-\theta) & \cos(-\theta) \end{pmatrix}$$

When an electric field component of the fundamental laser light incident on the nonlinear material 31 is expressed by ($E_x$, $E_y$), an electric field component ($E_x'$, $E_y'$) of the fundamental laser light after making a round trip in the nonlinear material 31 is expressed using the above-mentioned Jones matrix as follows.

$$\begin{pmatrix} E_x' \\ E_y' \end{pmatrix} = J \begin{pmatrix} E_x \\ E_y \end{pmatrix}$$

When the angle θ which the c axis of the nonlinear material 31 forms with the y axis is determined in such a way that the polarization direction of the electric field component ($E_x'$, $E_y'$) of the fundamental laser light after making a round trip in the nonlinear material 31 is rotated by 90 degrees with respect to the polarization direction of the electric field component ($E_x$, $E_y$) of the fundamental laser light incident on the nonlinear material 31 (in such a way that the phase difference between the electric field component in the x direction and the electric field component in the y direction is equal to π), the same effect as that of the ¼ wavelength plate can be provided for the nonlinear material 31. Because the polarization of the fundamental laser light experiences one rotation during two round trips in the nonlinear material 31 when the angle is determined in this way, the fundamental laser light has a polarized component which is certainly wavelength-converted during two round trips in the resonator, and therefore efficient wavelength converted light is acquired.

Further, even when the angle θ which the c axis of the nonlinear material 31 forms with the y axis is determined in such a way that the polarization direction of the electric field component ($E_x'$, $E_y'$) of the fundamental laser light after making a round trip in the nonlinear material 31 is rotated by 90 degrees/n with respect to the polarization direction of the electric field component ($E_x$, $E_y$) of the fundamental laser light incident on the nonlinear material 31 (in such a way that the phase difference between the electric field component in the x direction and the electric field component in the y direction is equal to π/n), the same effect as above is acquired. More specifically, because the polarization of the fundamental laser light experiences one rotation during 2n round trips in the nonlinear material 31, the fundamental laser light has a polarized component which is certainly wavelength-converted during 2n round trips in the resonator, and therefore efficient wavelength converted light is acquired.

According to this Embodiment 3, because the component count can be reduced compared with Embodiments 1 and 2 by providing the nonlinear material 31 with the effect of the wavelength plate, the manufacturing cost can be reduced. Further, because the optical components are few in number, a high-reliability planar waveguide laser device which requires a smaller number of adjustments can be constructed.

Although a solid state laser medium that is pumped by the semiconductor laser 11 to generate a gain is used as the laser medium 21 in the planar waveguide laser device shown in FIG. 9, the semiconductor laser 11 can be used as the laser medium. In the case in which the semiconductor laser is used this way, the component count can be further reduced. A further low cost and more reliable planar waveguide laser device can be constructed.

Further, although the case of second harmonic light is explained in above-mentioned Embodiments 1 to 3, these embodiments can also be applied to other wavelength conversion lasers (e.g., third harmonic, sum frequency, difference frequency, optical parametric oscillation, etc.).

As previously explained, because the planar waveguide laser device in accordance with Embodiment 3 includes: the laser medium that is shaped like a plate and has a waveguide structure in a direction of the thickness of a surface thereof perpendicular to the optical axis thereof; and the nonlinear material that is placed on the optical axis of the laser medium close to the laser medium and has a waveguide structure in the same direction as that of the waveguide structure of the laser medium, and the nonlinear material is a birefringent material in which its optic axis is placed in such away as to be inclined at a predetermined angle with respect to a waveguide direction in a plane perpendicular to the optical axis, a planar waveguide laser device that can perform wavelength conversion efficiently can be provided. Further, the number of types of materials selectable as a clad material can be increased.

While the invention has been described in its preferred embodiments, it is to be understood that an arbitrary combination of two or more of the above-mentioned embodiments can be made, various changes can be made in an arbitrary component in accordance with any one of the above-mentioned embodiments, and an arbitrary component in accordance with any one of the above-mentioned embodiments can be omitted within the scope of the invention.

INDUSTRIAL APPLICABILITY

As mentioned above, the planar waveguide laser device in accordance with the present invention has a structure of sandwiching both upper and lower surfaces of a thin plate-like laser medium extending in the traveling direction of laser light with clads whose refractive index is lower than that of the laser medium, and is suitable for use as a light source for a printer, a projection TV, and so on.

EXPLANATIONS OF REFERENCE NUMERALS 10 optical axis, 11 semiconductor laser, 21 laser medium, 22a, 22b end surface, 31 nonlinear material, 32a, 32b end surface, 33a, 33b clad, 41 ¼ wavelength plate, 42a, 42b end surface, 51 fundamental laser light, 52 wavelength converted light.

The invention claimed is:
1. A planar waveguide laser device comprising:
a laser medium that is shaped like a plate and has a waveguide structure in a direction of a thickness of a surface thereof perpendicular to an optical axis thereof, and that has a characteristic of generating a gain for both light rays which have equal wavelength and are polarized in directions perpendicular and horizontal to a waveguide of said waveguide structure, the laser medium outputting fundamental laser light which includes light rays having a perpendicular polarization and a horizontal polarization;

a nonlinear material that is placed on the optical axis of said laser medium close to said laser medium and has a waveguide structure in a direction which is same as that of the waveguide structure of said laser medium, and that performs wavelength conversion on the fundamental laser light to generate harmonic laser light; and a ¼ wavelength plate that is placed close to an opposite side to the laser medium with respect to the nonlinear material along the optical axis, and that rotates by 90-degrees a polarization direction of the fundamental laser light coming from the nonlinear material and returns the rotated fundamental laser light to the nonlinear material, the ¼ wavelength plate including a first surface facing with the nonlinear material and a second surface being an opposite side to the first surface along the optical axis.

2. A planar waveguide laser device comprising:

a laser medium that is shaped like a plate and has a waveguide structure in a direction of a thickness of a surface thereof perpendicular to an optical axis thereof, and that has a characteristic of generating a gain for both light rays which have equal wavelength and are polarized in directions perpendicular and horizontal to a waveguide of said waveguide structure, the laser medium outputting fundamental laser light which includes light rays having a perpendicular polarization and a horizontal polarization;

a nonlinear material that is placed on the optical axis of said laser medium close to said laser medium and has a waveguide structure in a direction which is same as that of the waveguide structure of said laser medium, and that performs wavelength conversion on the fundamental laser light to generate harmonic laser light, the nonlinear material outputting the harmonic laser light along the optical axis; and a ¼ wavelength plate that is placed close to an opposite side to the nonlinear material with respect to the laser medium along the optical axis, and that rotates by 90-degrees a polarization direction of the fundamental laser light coming from the nonlinear material via the laser medium and returns the rotated fundamental laser light to the nonlinear material, the ¼ wavelength plate including a first surface facing with the laser medium and a second surface being an opposite side to the first surface along the optical axis.

3. A planar waveguide laser device comprising:

a laser medium that is shaped like a plate and has a waveguide structure in a direction of a thickness of a surface thereof perpendicular to an optical axis thereof, and that has a characteristic of generating a gain for both light rays which have equal wavelength, and are polarized in directions perpendicular and horizontal to a waveguide of said waveguide structure, the laser medium outputting fundamental laser light which includes light rays having a perpendicular polarization and a horizontal polarization; and a nonlinear material that is placed on the optical axis of said laser medium close to said laser medium and has a waveguide structure in a direction which is same as that of the waveguide structure of said laser medium, and that performs wavelength conversion on the fundamental laser light to generate harmonic laser light, the nonlinear material outputting the harmonic laser light along the optical axis, and the nonlinear material including a first surface facing with the laser medium and a second surface being an opposite side to the first surface along the optical axis, wherein said nonlinear material is a birefringent material in which its optic axis is placed in such a way as to be inclined with respect to a waveguide direction in a plane perpendicular to the optical axis, the inclination of the nonlinear material being determined to rotate by 90-degrees a polarization direction of the fundamental laser light coming from the laser medium and return the rotated fundamental laser light to the laser medium.

4. The planar waveguide laser device according to claim 1, wherein said laser medium is a semiconductor laser.

5. The planar waveguide laser device according to claim 1, wherein said laser medium is a solid state laser medium that is pumped by a semiconductor laser placed close to said laser medium to generate a gain.

6. The planar waveguide laser device according to claim 1, wherein said ¼ wavelength plate has a waveguide structure in a direction which is same as that of the waveguide structure of said laser medium.

7. The planar waveguide laser device according to claim 1, wherein the first surface has an optical film which allows the fundamental laser light and the harmonic laser light to pass through, and the second surface has an optical film which reflects the fundamental laser light while allowing the harmonic laser light to pass through.

8. The planar waveguide laser device according to claim 2, wherein the first surface has an optical film which allows the fundamental laser light coming from the laser medium to pass through, and the second surface has an optical film which reflects the fundamental laser light coming from the laser medium.

9. The planar waveguide laser device according to claim 3, wherein the first surface has an optical film which allows the fundamental laser light and the harmonic laser light to pass through, and the second surface has an optical film which reflects the fundamental laser light while allowing the harmonic laser light to pass through.

* * * * *